(12) United States Patent
Okada

(10) Patent No.: US 7,602,086 B2
(45) Date of Patent: Oct. 13, 2009

(54) DRIVING DEVICE, EXPOSURE APPARATUS USING THE SAME, AND DEVICE MANUFACTURING METHOD

(75) Inventor: Yoshiyuki Okada, Sakura (JP)

(73) Assignee: Canon Kabushiki Kaisha, Tokyo (JP)

( * ) Notice: Subject to any disclaimer, the term of this patent is extended or adjusted under 35 U.S.C. 154(b) by 568 days.

(21) Appl. No.: 11/485,360

(22) Filed: Jul. 13, 2006

(65) Prior Publication Data

US 2007/0013895 A1 Jan. 18, 2007

(30) Foreign Application Priority Data

Jul. 14, 2005 (JP) .............................. 2005-206126

(51) Int. Cl.
*H02K 41/00* (2006.01)

(52) U.S. Cl. .......................................... 310/12; 310/13

(58) Field of Classification Search .................... 310/12, 310/13, 14
See application file for complete search history.

(56) References Cited

U.S. PATENT DOCUMENTS

| | | | |
|---|---|---|---|
| 3,689,885 A * | 9/1972 | Kaplan et al. ............... | 340/10.1 |
| 4,463,354 A * | 7/1984 | Sears ..................... | 340/870.02 |
| 4,864,292 A * | 9/1989 | Nieuwkoop ................. | 340/5.8 |
| 4,922,200 A * | 5/1990 | Jackson et al. ............. | 324/223 |
| 5,008,664 A * | 4/1991 | More et al. ............... | 340/854.8 |
| 5,172,160 A | 12/1992 | Van Eijk et al. ............. | 355/53 |
| 5,862,458 A * | 1/1999 | Ishii ........................ | 455/107 |
| 6,486,941 B1 | 11/2002 | Hazelton et al. ............. | 355/72 |
| 6,556,165 B2 * | 4/2003 | Fukushima et al. ............ | 342/75 |

FOREIGN PATENT DOCUMENTS

| | | |
|---|---|---|
| EP | 0 502 578 A1 | 9/1992 |
| JP | 2002-33270 | 1/2002 |
| JP | 2002-319535 | 10/2002 |

\* cited by examiner

*Primary Examiner*—Thanh-Tam T Le
(74) *Attorney, Agent, or Firm*—Fitzpatrick, Cella, Harper & Scinto

(57) ABSTRACT

A driving device includes an electromagnetic actuator indicating a first coil and a second coil which detects a change in magnetic flux generated by the first coil, and an electromagnetic actuator controller which feedback-controls the electromagnetic actuator. The electromagnetic actuator controller includes a modulator which gives a modulated signal, which is generated based on a target value in the feedback control, to the first coil, and a demodulator which demodulates an output signal from the second coil, and in which the target value is a target thrust of the electromagnetic actuator. The electromagnetic actuator controller includes a scale converter which performs a square-root arithmetic operation for the target value to feedback-control the electromagnetic actuator based on an output signal from the scale converter and a signal demodulated by the demodulator.

8 Claims, 11 Drawing Sheets

DRIVING DEVICE, EXPOSURE APPARATUS USING THE SAME, AND DEVICE MANUFACTURING METHOD

This application claims the benefit of Japanese Patent Application No. 2005-206126, filed on Jul. 14, 2005, which is hereby incorporated by reference herein in its entirety.

BACKGROUND OF THE INVENTION

1. Field of the Invention

The present invention relates to a driving device, an exposure apparatus using the driving device, and a device manufacturing method and, more particularly, to an exposure apparatus which can execute, using an electromagnetic actuator, high-speed, high-accuracy, high-efficiency, low-heat-generation stage control and anti-vibration control.

2. Description of the Related Art

In recent years, a demand has arisen for higher productivity of semiconductor integrated circuits, such as ICs and LSIs. Along with this trend, a semiconductor exposure apparatus needs to execute a high-speed exposure process. Meanwhile, to micronize the circuit pattern, an exposure target wafer and a reticle as a master of the circuit pattern need to be aligned on the order of nm or less.

A scanning exposure apparatus synchronously scans a reticle stage which holds a reticle and a wafer stage which holds a wafer. Exposure is performed while the reticle stage and wafer stage move at constant velocities in opposite directions. In general, the projection magnification ratio of a reticle to a wafer is 4:1, and the scanning velocity ratio of a reticle stage to a wafer stage is also 4:1. To improve the productivity, these stages are required to be driven at higher scanning velocities. Along with this demand, the scanning velocity of a wafer stage reaches several hundred mm/s.

As described above, a reticle stage and a wafer stage are required to be driven with high speed and high accuracy. Therefore, an actuator, which can drive these stages with high efficiency, low heat generation, and high accuracy, becomes indispensable.

As the actuator which drives a stage at high speed, a linear motor, which takes advantage of the Lorentz force generated upon supplying a current to a magnetic field, is available. The main constituent components of the linear motor are magnets, which generate magnetic fields, and coils, which supply currents. The relationship between the coil current and the obtained Lorentz force, i.e., thrust, exhibits good linearity and controllability. However, the linear motor requires a large power to obtain a large thrust because of poor efficiency. As a result, if the actuator is arranged near the reticle or the wafer, it becomes sometimes difficult to attain an alignment accuracy on the order of nm, due to heat from the actuator.

As an actuator capable of obtaining a large thrust with high efficiency and low heat generation, i.e., a small power, one that uses the principle of an electromagnetic actuator (also called an electromagnet) is available. A general electromagnetic actuator includes coils and two members containing ferromagnetic bodies. The two members are arranged to oppose each other through a small gap. One of these members is wound with a coil. A current is supplied to the coil to generate a closed magnetic flux loop in the two members. This produces an attraction force in the gap, through which these members oppose each other, thereby obtaining a thrust. In general, the gap is set at a very narrow interval, i.e., about several tens to several hundred μm. An actuator with very high efficiency can thus be realized.

In order to realize high-accuracy exposure by suppressing vibration conducted from the installation floor of an exposure apparatus, or a disturbance acting upon driving a wafer stage, an anti-vibration device for vibration insulation or vibration suppression becomes indispensable. While a disturbance acting upon driving the wafer stage at high speed becomes larger, further micropatterning is demanded of the exposure apparatus. To improve the vibration insulation or vibration suppression performance of the anti-vibration device, an active control operation for causing an actuator to cancel the disturbance is widely employed. A linear motor or an electromagnetic actuator is used as the actuator, but the advent of an actuator capable of obtaining a large thrust with low heat generation and high accuracy is demanded.

Unfortunately, an actuator which adopts an electromagnetic actuator poses the following problems. The generated magnetic flux is proportional to the coil current and inversely proportional to the gap. The relationship between the thrust and the magnetic flux density is given by:

$$F \propto B^2 \qquad (1)$$

$$v(F) \propto B \qquad (2)$$

$$\phi = B \cdot S \qquad (3)$$

$$\phi \propto I \qquad (4)$$

where F is the thrust, B is the magnetic flux density, $\phi$ is the magnetic flux, I is the coil current, and S is the cross-sectional area of the gap through which the members of the electromagnetic actuator oppose each other. From this relationship, it is found that the thrust exhibits a nonlinear characteristic to the coil current and gap, although high efficiency is achieved. Also, even a small change in coil current or gap causes a large variation in thrust.

A stage device using an electromagnetic actuator disclosed in Japanese Patent Laid-Open No. 2002-033270 is designed to be used such that the gap interval in the electromagnetic actuator is measured by a sensor and corrected to supply a coil current depending on the gap interval. However, this technique adopts a thrust correction method using an open loop to correct the coil current, depending on the measured gap interval, thereby matching the thrust with a predetermined one. Therefore, this technique is inappropriate as the control method for an actuator which executes high-accuracy control due to variations in characteristics of the electromagnetic actuator and coil.

In an alignment apparatus using an electromagnetic actuator disclosed in Japanese Patent Application Laid-Open No. 2002-319535, a change in magnetic flux generated in the magnetic actuator is detected by a newly arranged coil, integrated by an electrical integrator, and converted into a signal proportional to the magnetic flux. In accordance with the above equations (2) and (3), a feedback loop is formed to control the obtained signal to manipulate a coil current so as to match the thrust with a predetermined thrust F, thereby suppressing variations in characteristics of the electromagnetic actuator and coil. However, owing to the offset currents and offset voltages of the electronic components, which form an integrator and a signal amplifier, which detects a change in magnetic flux, an output from the integrator generates a lamp-shaped offset that increases along with the elapse of time even when the change in magnetic flux is zero. Finally, the output reaches the saturated voltage and becomes uncontrollable. To suppress this phenomenon, a high-pass filter is inserted in the feedback loop. However, the high-pass filter cannot make a response to a DC thrust or a thrust in a low-frequency band.

For this reason, this technique is inappropriate as a control method for an actuator which executes high-accuracy control.

SUMMARY OF THE INVENTION

The present invention has been made in consideration of the above situation, and has as its object to provide a novel technique for an electromagnetic actuator.

According to a first aspect of the present invention, a driving device comprises an electromagnetic actuator including a first coil and a second coil, which detects a change in magnetic flux generated by the first coil, and an electromagnetic actuator controller, which feedback-controls the electromagnetic actuator. The electromagnetic actuator controller is characterized by comprising a modulator, which gives a modulated signal to the first coil, and a demodulator, which demodulates an output signal from the second coil.

According to a second aspect of the present invention, a stage device includes a coarse moving stage and a fine moving stage, characterized in that the fine moving stage is driven relative to the coarse moving stage by the above-described driving device.

According to a third aspect of the present invention, an exposure apparatus comprises the above-described driving device, an optical system to project exposure light applied to a master on which a pattern is formed onto a substrate, and a stage device, which holds the substrate or the master and is aligned by the driving device.

According to a fourth aspect of the present invention, an exposure apparatus causes the above-described driving device to drive a mount to support a projection optical system.

According to a fifth aspect of the present invention, a device manufacturing method comprises steps of preparing a substrate on which a latent image pattern is formed using the above-described exposure apparatus, and developing the latent image pattern.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE EMBODIMENTS

Preferred embodiments of the present invention will be described in detail below.

First Embodiment

Figure 1:
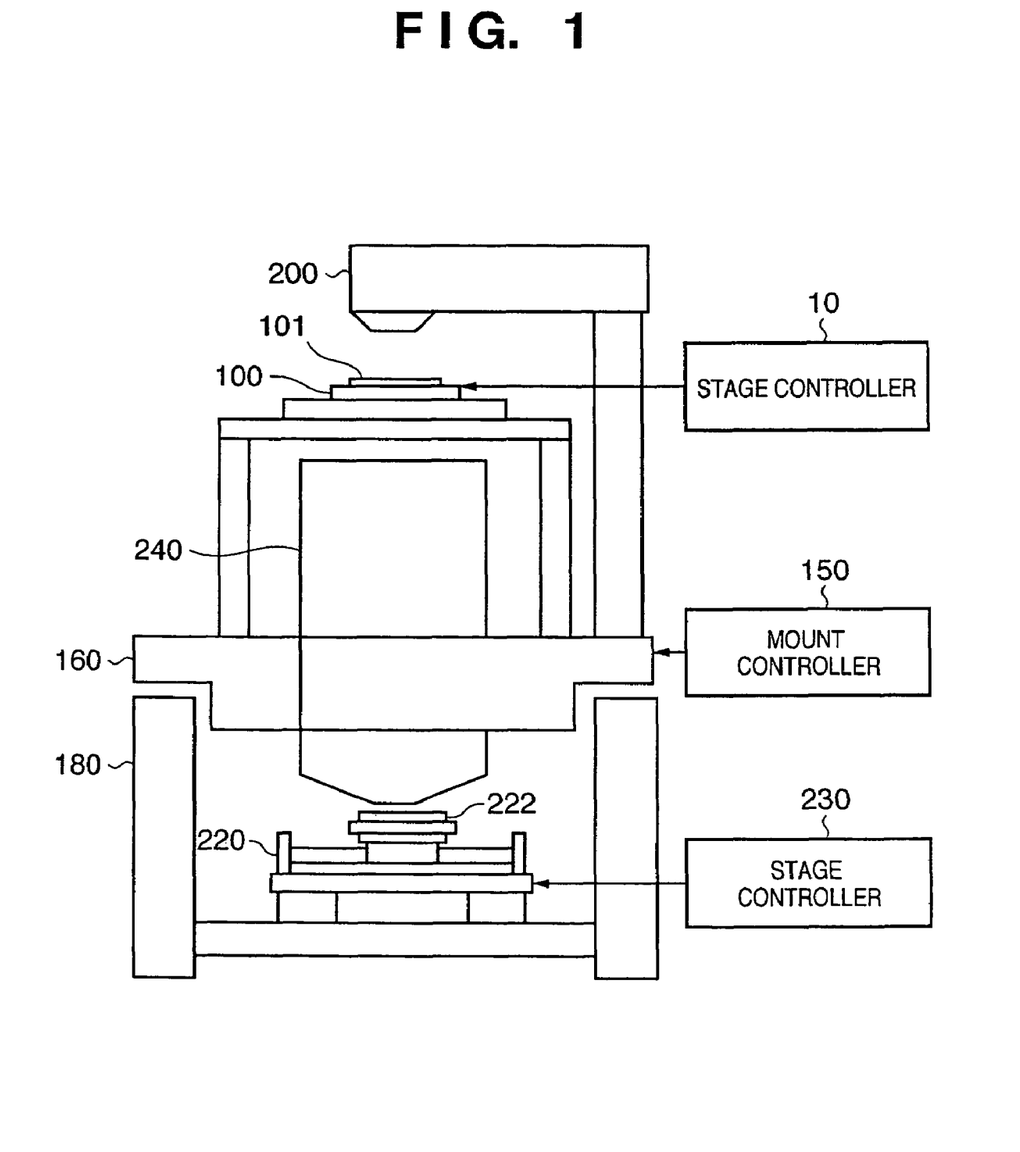
FIG. 1 is a view showing the structure of an exposure apparatus according to the preferred first embodiment of the present invention.

FIG. 1 is a view showing the structure of an exposure apparatus according to the preferred first embodiment of the present invention.

Exposure light emitted from an exposure light source (not shown) is guided to illuminate a reticle 101 arranged on a reticle stage 100 through an illumination optical system 200. The light transmitted through the reticle 101 penetrates through a projection optical system 240 and reaches a wafer 222 arranged on a wafer stage 220. With this structure, a micropattern drawn on the reticle 101 is printed on chips on the wafer 222. The exposure light source desirably adopts, e.g., a KrF laser beam source or an ArF laser beam source having a shorter wavelength for further micropatterning.

In a scanning stepper (scanning exposure apparatus), the reticle stage 100 and wafer stage 220 are synchronously controlled by stage controllers 10 and 230. Exposure is performed during synchronous scanning. When exposure of the current chip is complete, the wafer stage 220 is driven step by step to expose the next one. The scanning exposure apparatus accelerates the reticle stage 100 and wafer stage 220 at higher accelerations and performs synchronous scanning exposure at higher velocities. In general, reduction exposure is practiced. Normally, the exposure reduction ratio of the reticle 101 to the wafer 222 is 4:1, and both of the acceleration and velocity ratios of the reticle stage 100 to the wafer stage 220 are also 4:1. The accelerations and velocities of these stages are still increasing. The acceleration and velocity of the wafer stage 220 have increased up to about 1 G to 1.5 G and 300 mm/s to 600 mm/s, respectively. The wafer stage 220 is installed on a floor or base frame 180. The projection optical system 240 is fastened to a mount 160 to eliminate the influence of vibration conducted from the floor or vibration generated upon driving the wafer stage 220. The mount 160 is actively controlled by a mount controller 150, so as to allow an actuator to cancel vibration conducted from the base frame 180.

The reticle stage 100 and wafer stage 220 need to be driven at very high speed for improvement in productivity, and subjected to position or speed control with very high accuracy for micropatterning exposure.

In general, these stages are levitated by air or a magnetic force. The stages are synchronously scanned or driven step by step by an actuator, such as a linear motor or plane motor using the principle of the Lorentz force. The stage positions need to be controlled on the order of nm for micropatterning exposure. In general, the stage positions are exactly monitored by a laser interferometer (not shown) and feedback-controlled by the stage controllers 10 and 230.

Figure 2:
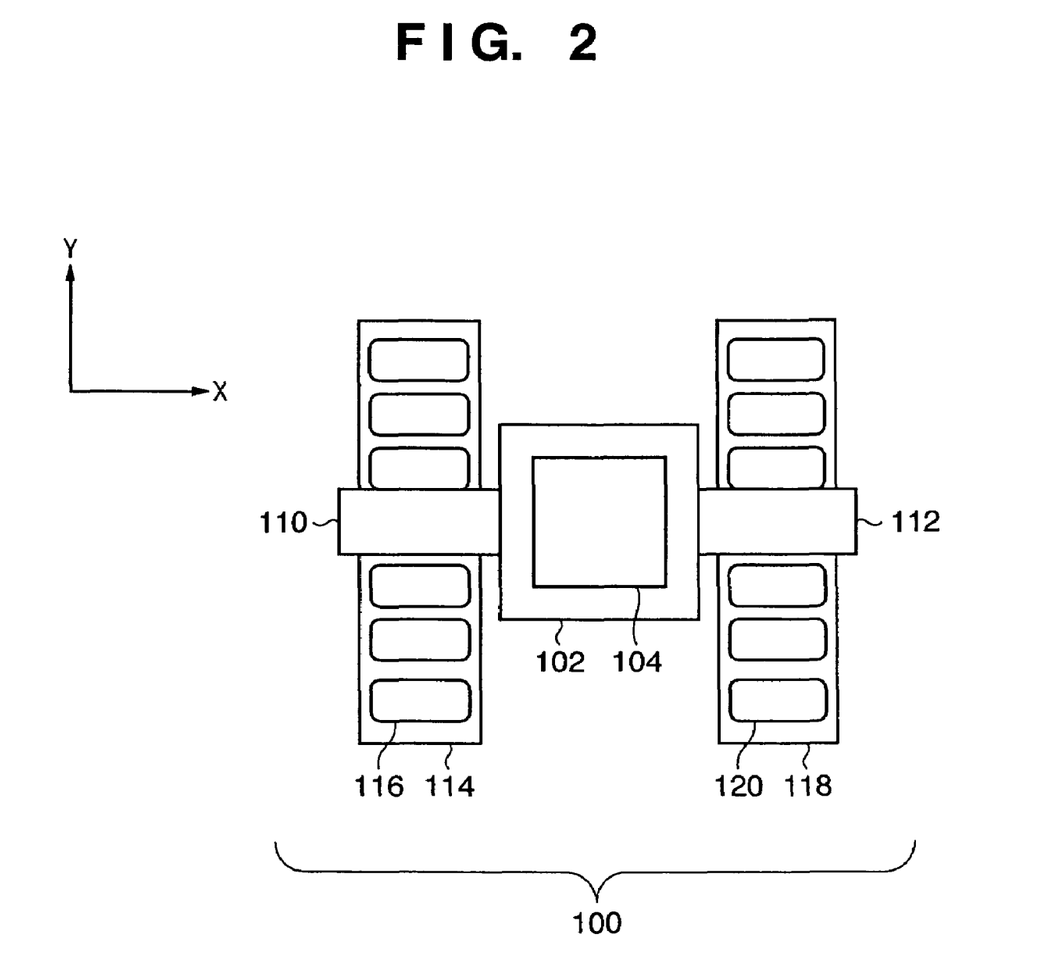
FIG. 2 is a view showing an example of the structure of a reticle stage.

FIG. 2 shows an example of the structure of the reticle stage 100 using a linear motor. The synchronous scanning direction is defined as the Y axis direction. Another plane axis, i.e., an axis perpendicular to the Y-axis is defined as the X-axis. The reticle stage 100 includes a coarse moving stage 102 and a fine moving stage 104. Movable elements 110 and 112 are attached to the coarse moving stage 102. Magnets are attached to the upper and lower portions of the movable elements 110 and 112, so as to generate a magnetic field in the vertical direction. Groups of a plurality of coils 116 and 120 are attached to stators 114 and 118. Of the coil groups 116 and 120, a current is supplied to a coil in the magnetic field in the vertical direction. This generates the Lorentz force in a direction perpendicular to the coil current and magnetic field. The Lorentz force acts as a thrust to drive the coarse moving stage 102. The actuator having such a structure is generally called a linear motor. A linear motor has good linearity of the obtained thrust supplied to the coil current. The main heat generating portions of the linear motor are the coil groups 116 and 120. Accelerating/decelerating the linear motor at very high speed generates a large amount of heat. Therefore, the coil groups 116 and 120 are arranged to be spaced apart from the fine moving stage 104. Heat generated by each of the coil groups 116 and 120 is removed by a cooling mechanism (not shown), so as to avoid its influence on the reticle 101 (not shown) held on the fine moving stage 104. Position control on the order of nm is executed by the fine moving stage 104. Therefore, position control using the coarse moving stage 102 may be done with an accuracy lower than that in position control using the fine moving stage 104.

Figure 3:
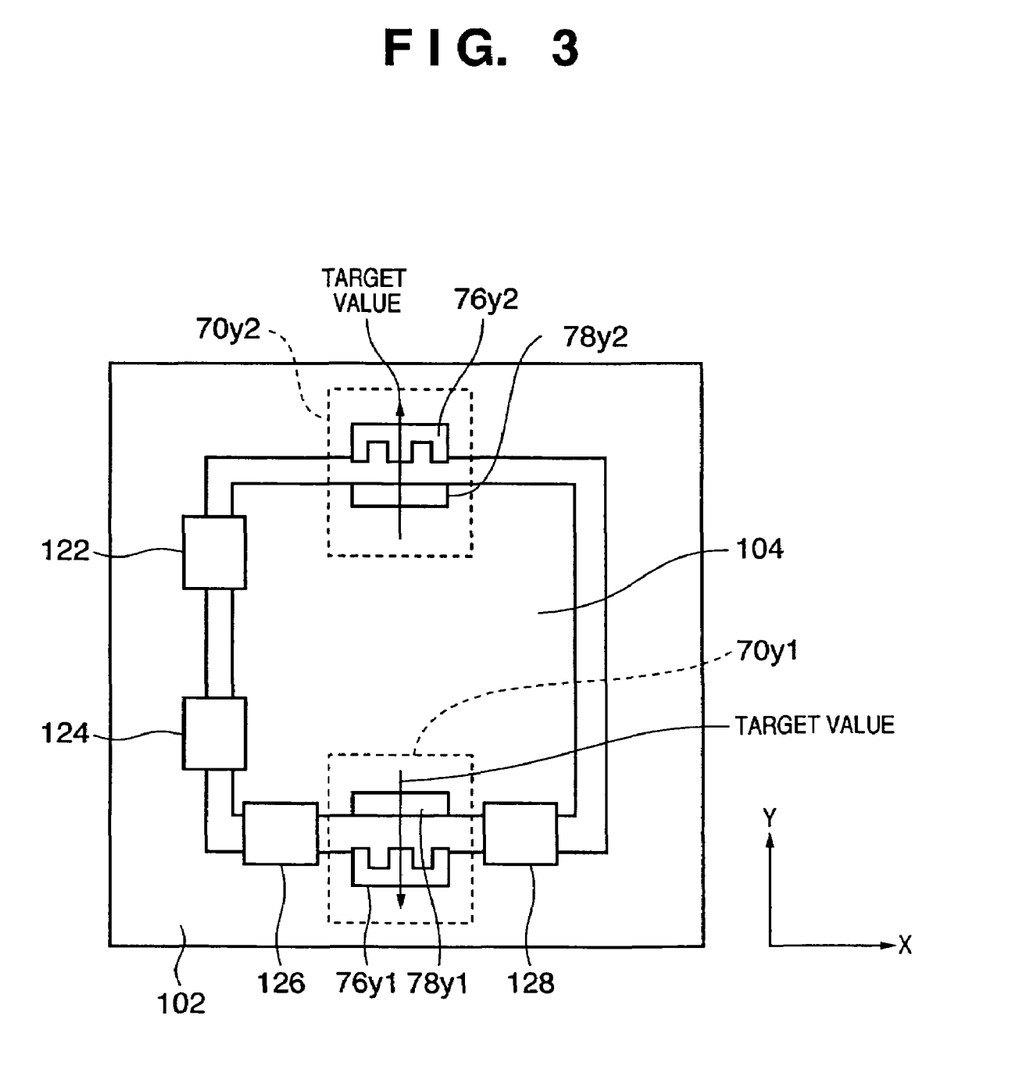
FIG. 3 is a view showing an example of the structure of a reticle stage according to the preferred first embodiment of the present invention.

FIG. 3 shows an example of the structure of an actuator to control the fine moving stage 104.

Linear motors 122 and 124 include magnets and coils (both of which are not shown) like that attached to the coarse moving stage 102 shown in FIG. 2, and generate thrusts in the Y direction. Similarly, linear motors 126 and 128 generate thrusts in the X direction.

An electromagnetic actuator (electromagnet) 70y1 includes an E core 76y1 and an I core 78y1, each formed from a magnetic body. As such a magnetic body, a ferromagnetic body, such as iron, is desirably used. An attraction force is generated between the E core and the I core of the electromagnetic actuator 70y1 in accordance with the operation principle of an electromagnetic actuator (to be described later). The electromagnetic actuator 70y1 thus gives a thrust to the fine moving stage 104 in a direction shown in FIG. 3.

Similarly, an electromagnetic actuator 70y2 includes an E core 76y2 and an I core 78y2. The electromagnetic actuator 70y2 gives a thrust to the fine moving stage 104 in a direction shown in FIG. 3.

By setting the gap between an E core and an I core to about several tens to several hundred μm, a large thrust can be obtained by a small current. The fine moving stage 104 is given a large thrust in the Y-axis direction with very low heat generation, by the electromagnetic actuators 70y1 and 70y2.

Position control in the X and Y directions on the order of nm is executed by the linear motors 122, 124, 126, and 128. Thrusts required to accelerate/decelerate the linear motors are applied thereto by the electromagnetic actuators 70y1 and 70y2. This allows the linear motors 122, 124, 126, and 128 to achieve low-heat-generation, and accurate position control, on the order of nm, with a minimum coil current.

Figure 4:
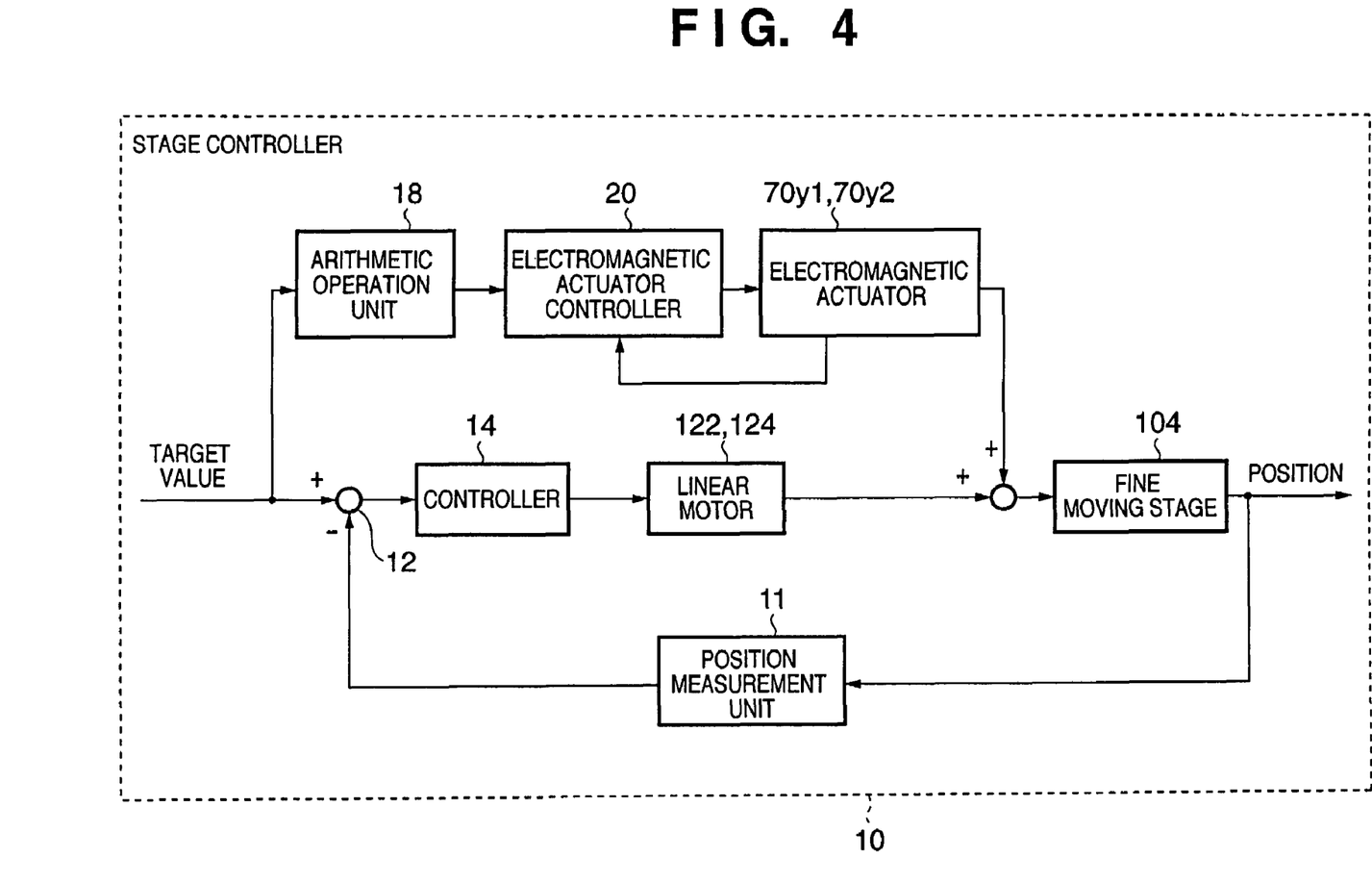
FIG. 4 is a block diagram showing the configuration of a stage controller according to the preferred first embodiment of the present invention.

FIG. 4 shows an example of control of the fine moving stage 104 by the stage controller 10.

Position information of the fine moving stage 104 is measured by a position measurement unit 11, such as a laser interferometer. The measured position information is input to an adder-subtractor 12, to calculate its deviation from the target position information as the target value of the fine moving stage 104. The obtained deviation signal is input to a controller 14 and subjected to a PID control arithmetic operation, and the like, to drive the linear motors 122 and 124. The fine moving stage 104 is accurately controlled, as described above. The target value is input to an arithmetic operation unit 18, to cause it to calculate a thrust Fy required to drive the fine moving stage 104. The thrust Fy is expressed by:

$$Fy = m \cdot \alpha \qquad (5)$$

where m is the mass (kg) of the fine moving stage 104, and $\alpha$ is the acceleration (m/s$^2$). The thrust Fy can be calculated by multiplying the given mass by the second-order derivative of the target position information.

The output from the arithmetic operation unit 18 is input to an electromagnetic actuator controller (electromagnet controller) 20 (to be described later) to cause it to drive the electromagnetic actuators 70y1 and 70y2. With this operation, the fine moving stage 104 is driven with low heat generation and a large thrust.

Figure 5:
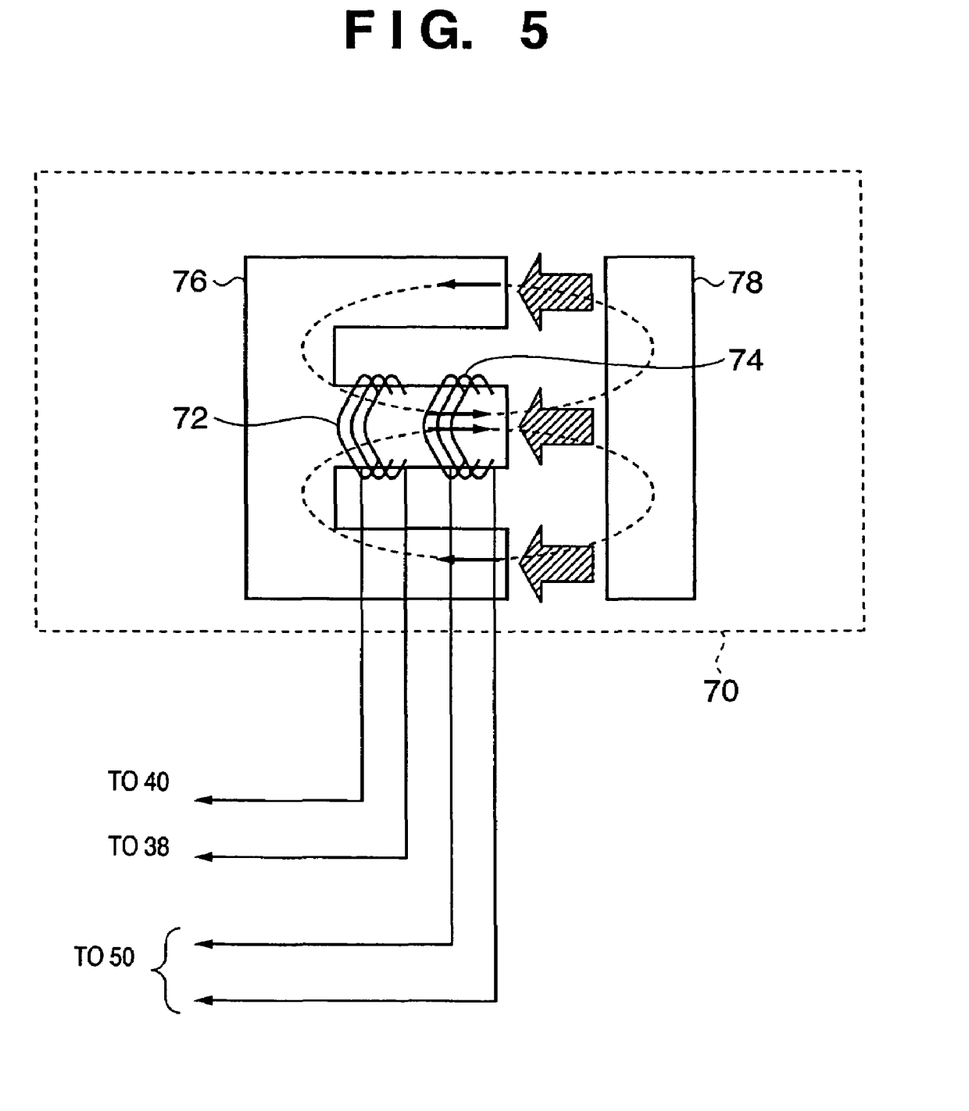
FIG. 5 is a view showing an example of the structure of an electromagnetic actuator according to a preferred embodiment of the present invention.

FIG. 5 shows an example of the structure of an electromagnetic actuator 70.

A driving coil 72 is wound around an E core 76. Magnetic fluxes indicated by dotted lines are generated in the E core 76 and an I core 78 by supplying a current to the driving coil 72. Magnetic poles are generated on the surfaces of the E core 76 and an I core 78, which oppose each other. An attraction force by a magnetic force is thus generated. A detection coil 74 is also wound around the E core 76. The detection coil 74 provides the ability to detect a change in magnetic flux generated by the driving coil 72.

Figure 6:
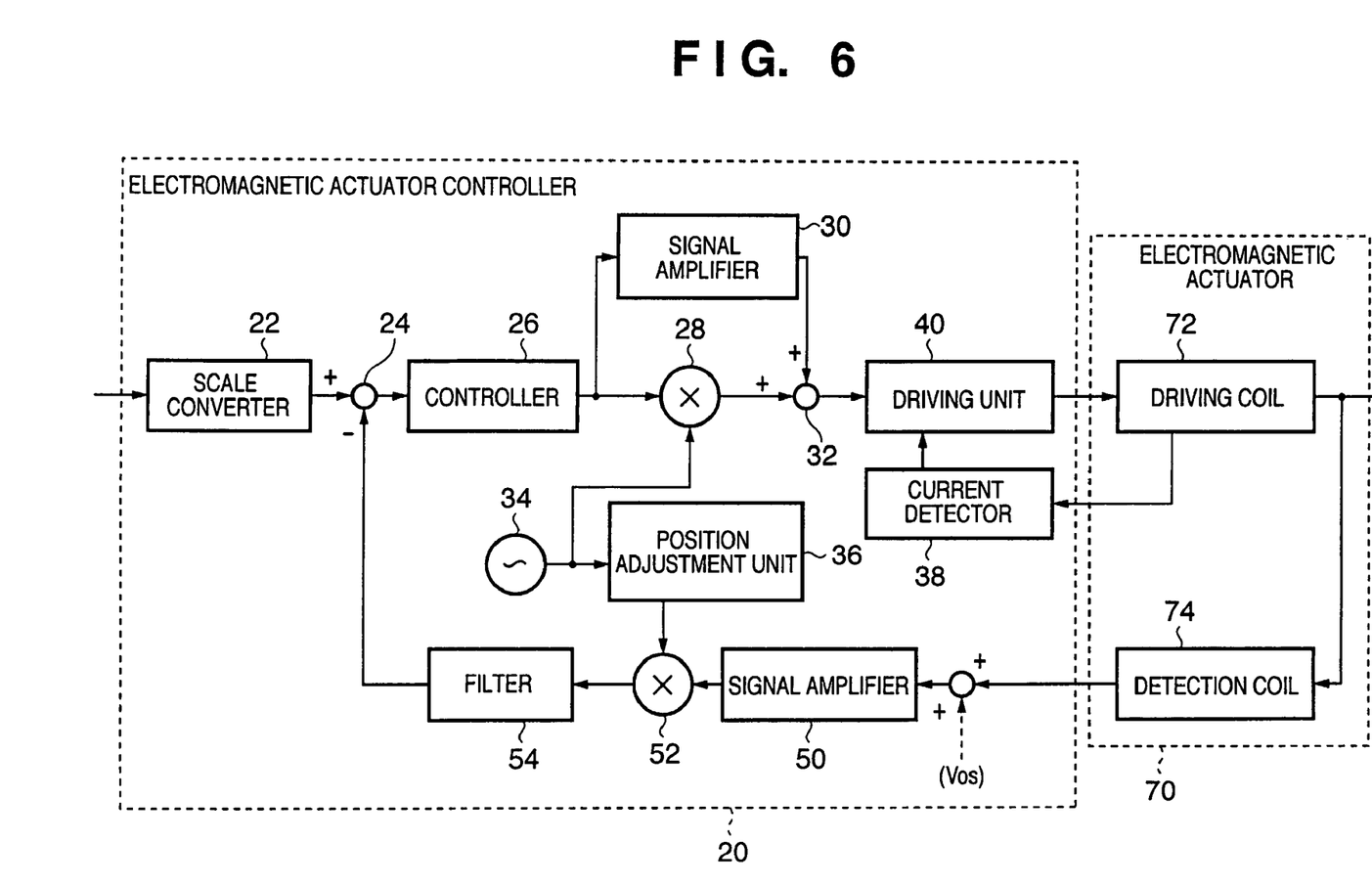
FIG. 6 is a block diagram showing the control configuration of an electromagnetic actuator 70 using an electromagnetic actuator controller 20 according to the preferred first embodiment of the present invention.

FIG. 6 shows an example of the control configuration of the electromagnetic actuator 70 by the electromagnetic actuator controller 20.

A controller 26 is a control arithmetic operation unit for proportional gain or PID. An output signal from the controller 26 is defined as Va. A signal amplifier 30 amplifies the output signal Va. The gain of the signal amplifier 30 is defined as Gx. An oscillator 34 generates a signal (modulated signal) having a constant oscillation width and a predetermined frequency. This signal desirably exhibits a rectangular or sine wave. For descriptive convenience, this signal is regarded as a sine wave having an amplitude of one and an angular frequency $\omega$. However, the present invention is not limited to this. A multiplier 28 as a modulator multiplies the output signal Va from the controller 26 by the signal from the oscillator 34. An adder 32 adds the signal from the signal amplifier 30 to the signal from the multiplier 28 and inputs the sum to a driving unit 40. Accordingly, we have:

the input to the driving unit $40 = Va(Gx + \sin(\omega t))$. (6)

The detection coil 74 detects a change in magnetic flux generated by the driving coil 72, so its output becomes zero in a steady state. However, in this embodiment, the output signal Va from the controller 26 is multiplied by the signal from the oscillator 34. This makes it possible to obtain a signal from the detection coil 74. Since the detection coil 74 performs a derivative action, the higher its frequency, the larger its output amplitude. This is more convenient for signal detection.

Figure 7:
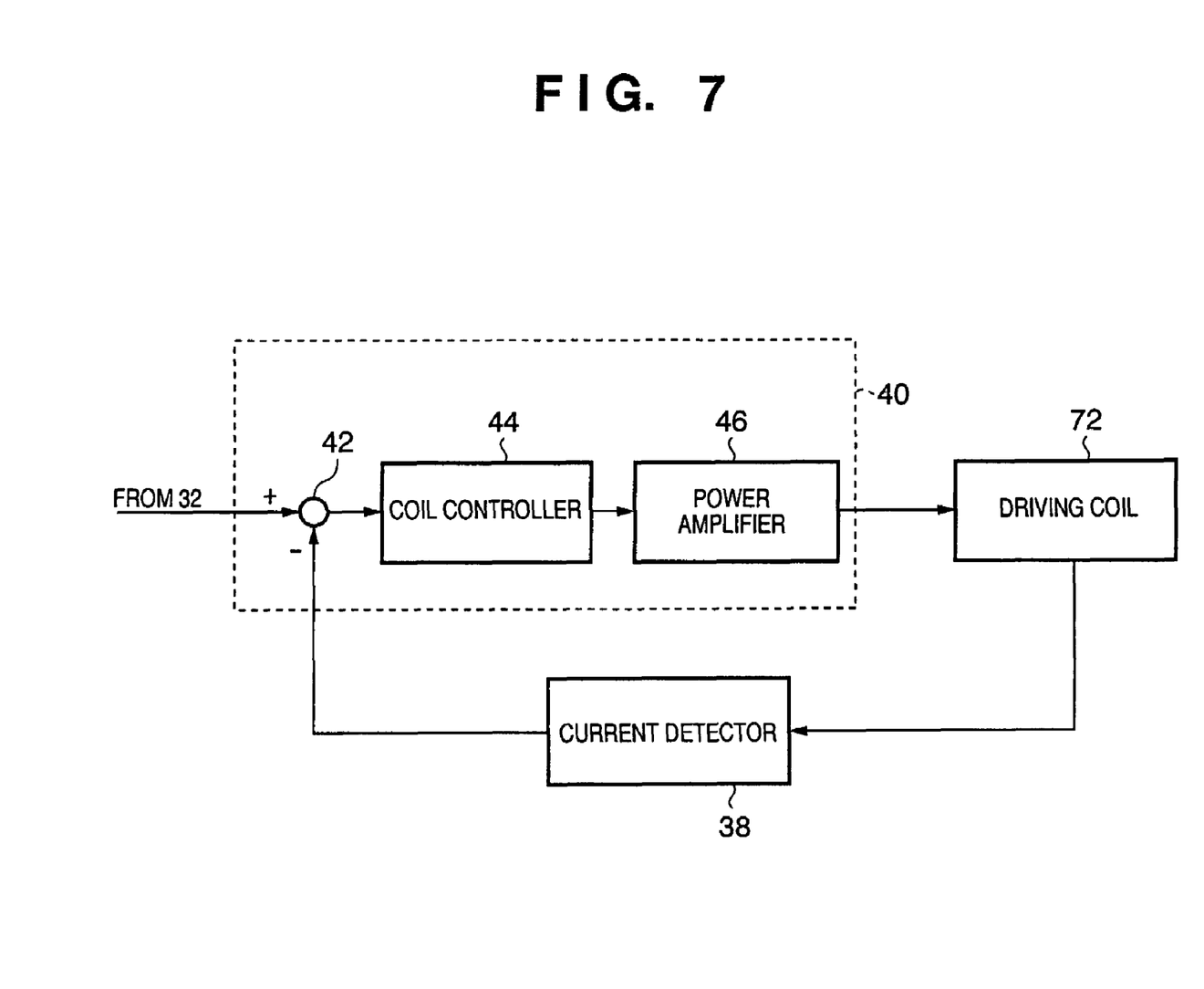
FIG. 7 is a block diagram showing an example of the configuration of a driving unit according to a preferred embodiment of the present invention.

The driving unit 40 will be described here with reference to FIG. 7. A coil current is supplied to the driving coil 72 in accordance with a signal from a power amplifier 46. This coil current is detected by a current detector 38. The current detector 38 includes, for example, a resistance and a signal amplifier as needed, converts a coil current into a voltage, and outputs the converted voltage. The signal from the current detector 38 is input to an adder-subtractor 42 to calculate its deviation from the output signal from the adder 32. The obtained deviation signal is input to a coil controller 44. The coil controller 44 performs a control arithmetic operation for proportional gain or PID. The obtained signal is input to the power amplifier 46, which supplies a voltage and current required to drive the driving coil 72. Feedback-controlling the coil current makes it possible to control it to a value which has a correlation with the output signal from the adder 32. Letting the coil current value be Icc, and the equivalent gain in the driving unit 40 be Gcc, $$Icc = Va \cdot Gcc(Gx + \sin(\omega t)) \tag{7}$$

From equation (4), we have $$\phi \propto Icc = Va \cdot Gcc(Gx + \sin(\omega t)). \tag{8}$$

A thrust F is expressed by:

$$F \propto S \cdot \phi^2. \tag{9}$$

The detection coil 74 detects a change in magnetic flux generated in the electromagnetic actuator 70. Let the output signal from the detection coil 74 be Vn. Differentiating equation (8) yields $$Vn = \omega \cdot Va \cdot Gcc \cdot \cos(\omega t). \tag{10}$$

For example, if an oscillation frequency f of the oscillator 34 is set to 20 kHz, $$\omega = 2 \cdot \pi \cdot f = 2 \cdot \pi \cdot 20 * 10^3. \tag{11}$$

As is obvious from this equation, as the oscillation frequency f increases, a larger output signal can be obtained.

In equation (8), a magnetic flux component φva generated in the electromagnetic actuator 70 in accordance with the output signal Va·Gx from the signal amplifier 30 is expressed by:

$$\phi va \propto Va \cdot Gcc \cdot Gx. \tag{12}$$

The detection signal from the detection coil 74 decreases when the magnetic flux slowly changes. If the output signal Va exhibits a direct current, the component Va·Gcc·Gx of the output signal from the detection coil becomes zero in accordance with equation (10).

Assume that an offset voltage Vos is superposed, as a disturbance, on the output from the detection coil 74 and the input to a signal amplifier 50. Letting the gain of the signal amplifier 50 be Ga, an output signal from the signal amplifier 50 is expressed by:

$$Vn = Ga(\omega \cdot Va \cdot Gcc \cdot \cos(\omega t) + Vos). \tag{13}$$

Since the signal from the detection coil 74 is differentiated with respect to the oscillation signal, their phases are different by 90°. Therefore, the phase of the signal from the oscillator 34 is adjusted to be synchronous or have a phase difference of 180°. A multiplier 52 as a demodulator multiplies the phase adjusted signal from the phase adjustment unit 36 by the signal from the signal amplifier 50. Letting an output signal from the multiplier 52 be Vm, Vm is expressed by:

$$\begin{aligned} Vm &= Ga(\omega \cdot Va \cdot Gcc \cdot \cos(\omega t) + Vos) \cdot \cos(\omega t) \\ &= 1/2 \cdot Ga \cdot \omega \cdot Va \cdot Gcc(1 + \cos(2\omega t)) + Ga \cdot Vos \cdot \cos(\omega t) \end{aligned} \tag{14}$$

A low-pass filter which sufficiently attenuates the frequency components cos(ωt) and cos(2ωt) in equation (14) is formed from a filter 54. Letting an output from the filter 54 be Vfb, Vfb is given by:

$$Vfb = 1/2 \cdot Ga \cdot \omega \cdot Va \cdot Gcc. \tag{15}$$

The relationship between the signal obtained by equation (15) and the magnetic flux component φva generated in the electromagnetic actuator 70 in accordance with the output signal Va·Gcc·Gx from the signal amplifier 30 given by relation (12) satisfies:

$$\phi va \propto Vfb. \tag{16}$$

In this manner, modulation by the multiplier 28, signal amplification by the differential effect of the detection signal from the detection coil 74, demodulation by the multiplier 52, and removal of a high-frequency band by the filter 54 are executed. The influence of the disturbance Vos is thus eliminated. This makes it possible to exactly detect a signal which has a correlation with the magnitude of a magnetic flux generated in the electromagnetic actuator 70, in accordance with the output signal Va from the controller 26.

The output signal from the filter 54 is input to an adder-subtractor 24 to calculate its deviation from a signal from a scale converter 22. The obtained deviation signal is input to the controller 26 to control the coil current, such that the magnetic flux generated in the electromagnetic actuator 70 becomes equal to the output signal from the scale converter 22.

From relation (16), the output signal from the filter 54 is proportional to the magnetic flux. Accordingly, the target magnetic flux to obtain a necessary thrust is represented by the square root of the thrust value from equation (2), which expresses the relationship between the thrust and the magnetic flux. Therefore, when the input to the scale converter 22 is set as the target thrust value, the scale converter 22 performs a square-root arithmetic operation.

When the gap between an E core and an I core varies, the magnitude of a magnetic flux generated in the electromagnetic actuator 70 changes. As a result, a thrust largely varies proportionally to the square of the magnetic flux, in accordance with equation (1). However, magnetic flux components generated in the electromagnetic actuator 70 are detected and feedback-controlled, by controlling the electromagnetic actuator, as described above. This makes it possible to control a magnetic flux to the target independently of a variation in gap, so as to obtain the target thrust.

As described above, in the preferred embodiment of the present invention, a signal correlated to the magnitude of a magnetic flux generated in an electromagnetic actuator is exactly detected, and feedback-controlled, while eliminating the influence of disturbance. This makes it possible to suppress the influence of a variation in gap in the magnetic actuator, so as to obtain the target thrust. High-speed, high-accuracy, high-efficiency, and low-heat-generation stage control can thus be realized.

Second Embodiment

Figure 8:
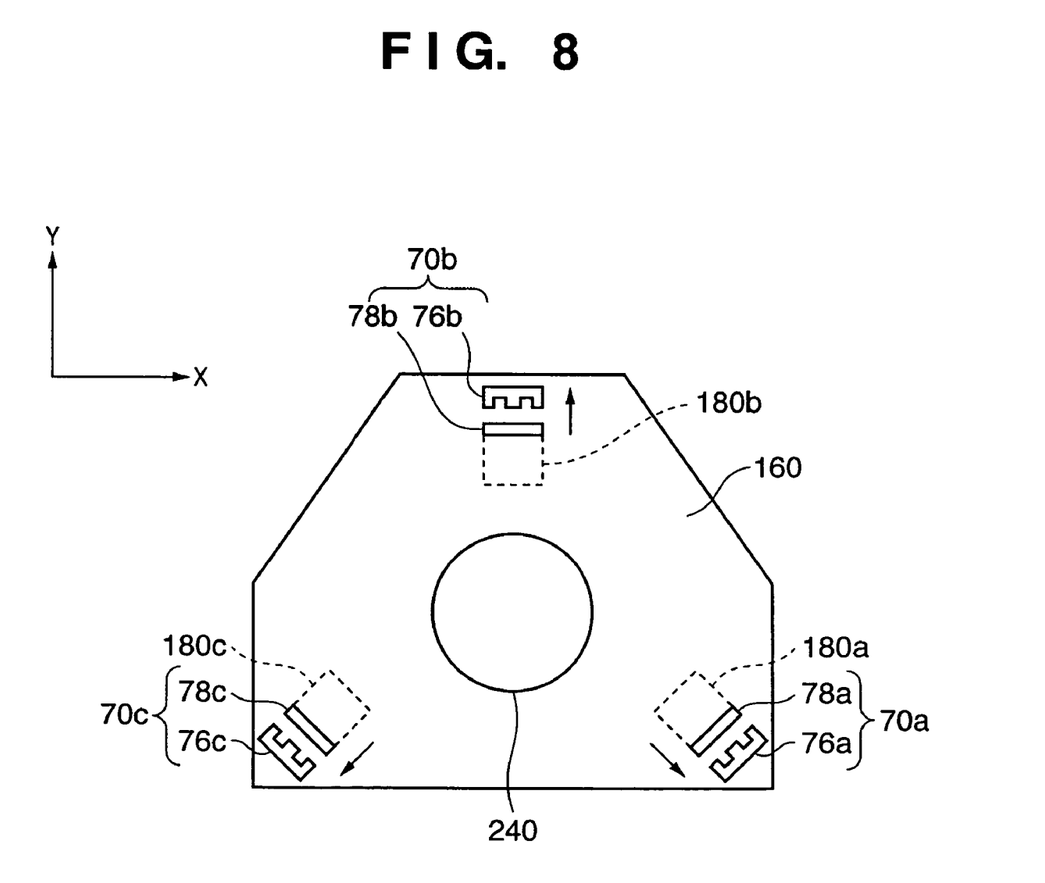
FIG. 8 is a view showing an example of the structure of a mount according to the preferred second embodiment of the present invention.

The preferred second embodiment of the present invention will be described below with reference to FIG. 8. The same reference numerals as those in the first embodiment denote the constituent elements, which execute similar operations, and a description thereof will be omitted. FIG. 8 is a view showing the schematic structure of a mount 160, which supports a projection optical system 240 and eliminates the influence of vibration conducted from the floor or vibration generated upon driving a wafer stage 220. Electromagnetic actuators 70a, 70b, and 70c respectively include E cores 76a, 76b, and 76c and I cores 78a, 78b, and 78c. The E cores 76a, 76b, and 76c are attached to the mount 160. The I cores 78a, 78b, and 78c are attached to base frame pillars 180a, 180b, and 180c. The three electromagnetic actuators 70a, 70b, and 70c generate attraction forces in the directions indicated by arrows in FIG. 8, to control the position of the mount 160 in the X and Y directions.

Figure 9:
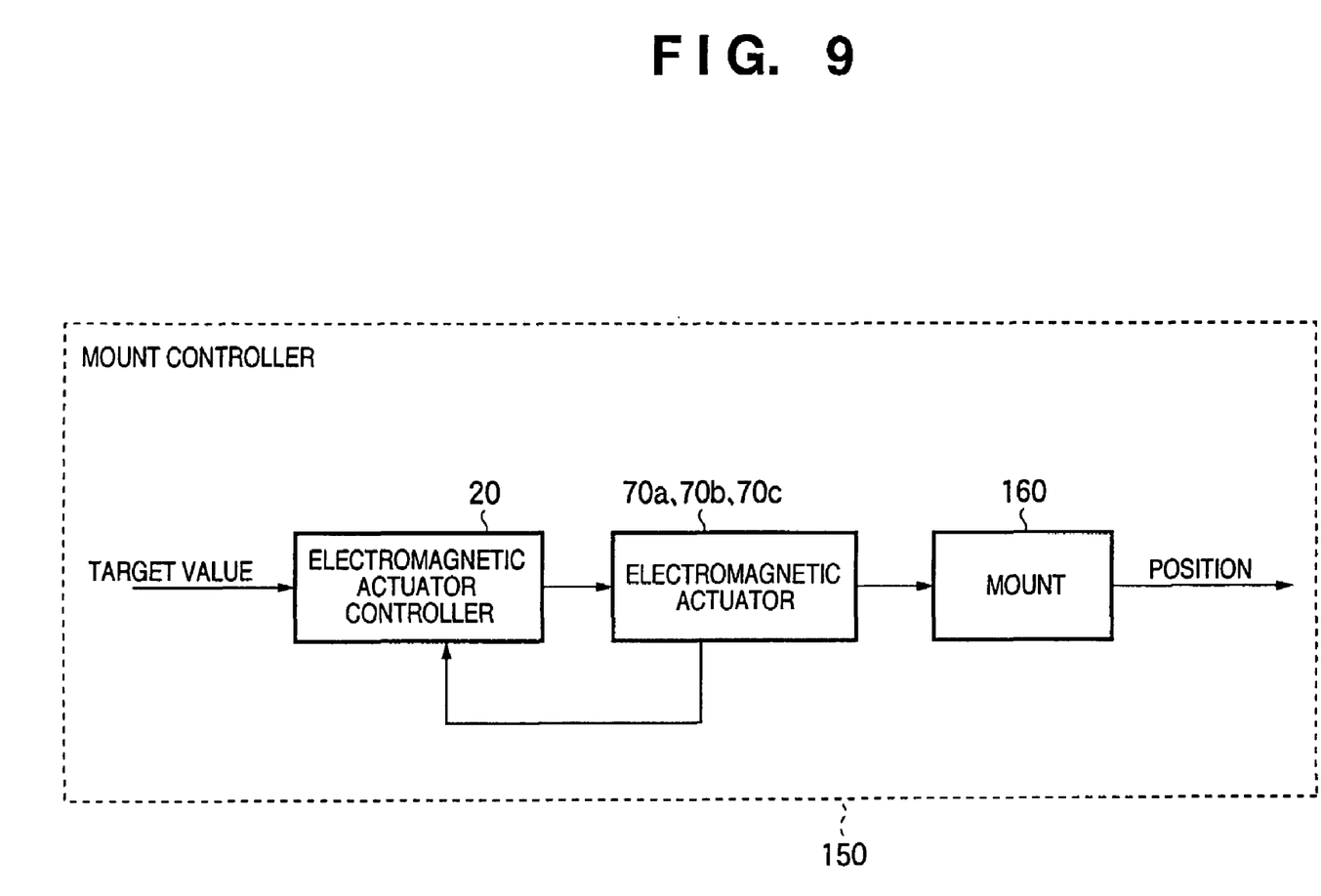
FIG. 9 is a block diagram showing the configuration of a mount controller according to the preferred second embodiment of the present invention.

FIG. 9 shows an example of control of the mount 160 by a mount controller 150. An electromagnetic actuator controller 20 receives an output from an acceleration sensor (not shown) in the X or Y direction, which detects an acceleration due to vibration conducted from the floor or vibration generated upon driving a wafer stage 220. The electromagnetic actuator controller 20 may also receive, as the target value, a thrust required to cancel a pre-calculated or predicted excitation force applied to the mount 160 in the X or Y direction upon driving the wafer stage 220. By the same operation as that in the first embodiment, the electromagnetic actuator controller 20 drives the electromagnetic actuators 70a, 70b, and 70c attached to the mount 160 and the pillars of the base frame 180. The electromagnetic actuator controller 20 exactly generates a thrust required to cancel a disturbance due to vibration conducted to the mount 160 from the floor, or vibration generated upon driving the wafer stage 220, thereby suppressing the vibrations.

According to the preferred embodiments of the present invention, a signal correlated to the magnitude of a magnetic flux generated in an electromagnetic actuator is exactly detected and feedback-controlled, while eliminating the influence of disturbance. This makes it possible to suppress the influence of a variation in gap in the magnetic actuator, so as to obtain the target thrust. High-speed, high-accuracy, high-efficiency, and low-heat-generation stage control can thus be realized.

Application Example

Figure 10:
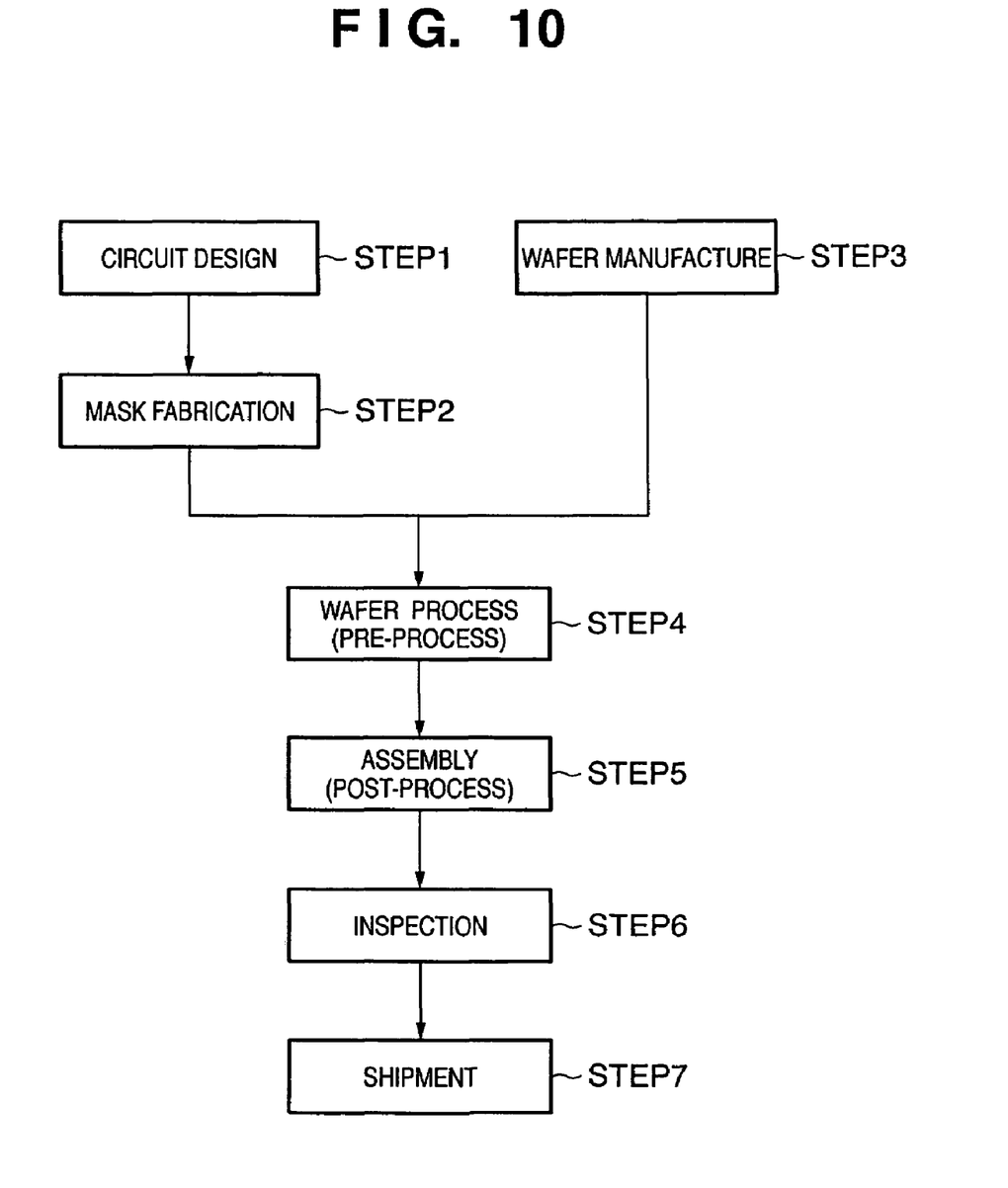
FIG. 10 is a flowchart showing a device manufacturing method.

A semiconductor device manufacturing process using the above-described exposure apparatus will be described below. FIG. 10 is a flowchart showing the flow of the overall semiconductor device manufacturing process. In step 1 (circuit design), the circuit of a semiconductor device is designed. In step 2 (mask fabrication), a mask (also called a master or reticle) is fabricated based on the designed circuit pattern.

In step 3 (wafer manufacture), a wafer (also called a substrate), is manufactured using a material such as silicon. In step 4 (wafer process), called a pre-process, the above-described exposure apparatus is caused to form an actual circuit on the wafer by lithography, using the mask and wafer. In step 5 (assembly), called a post-process, a semiconductor chip is formed using the wafer manufactured in step 4. This step includes an assembly step (dicing and bonding) and a packaging step (chip encapsulation). In step 6 (inspection), the semiconductor device manufactured in step 5 undergoes inspections, such as an operation confirmation test and a durability test. After these steps, the semiconductor device is completed and shipped, in step 7.

Figure 11:
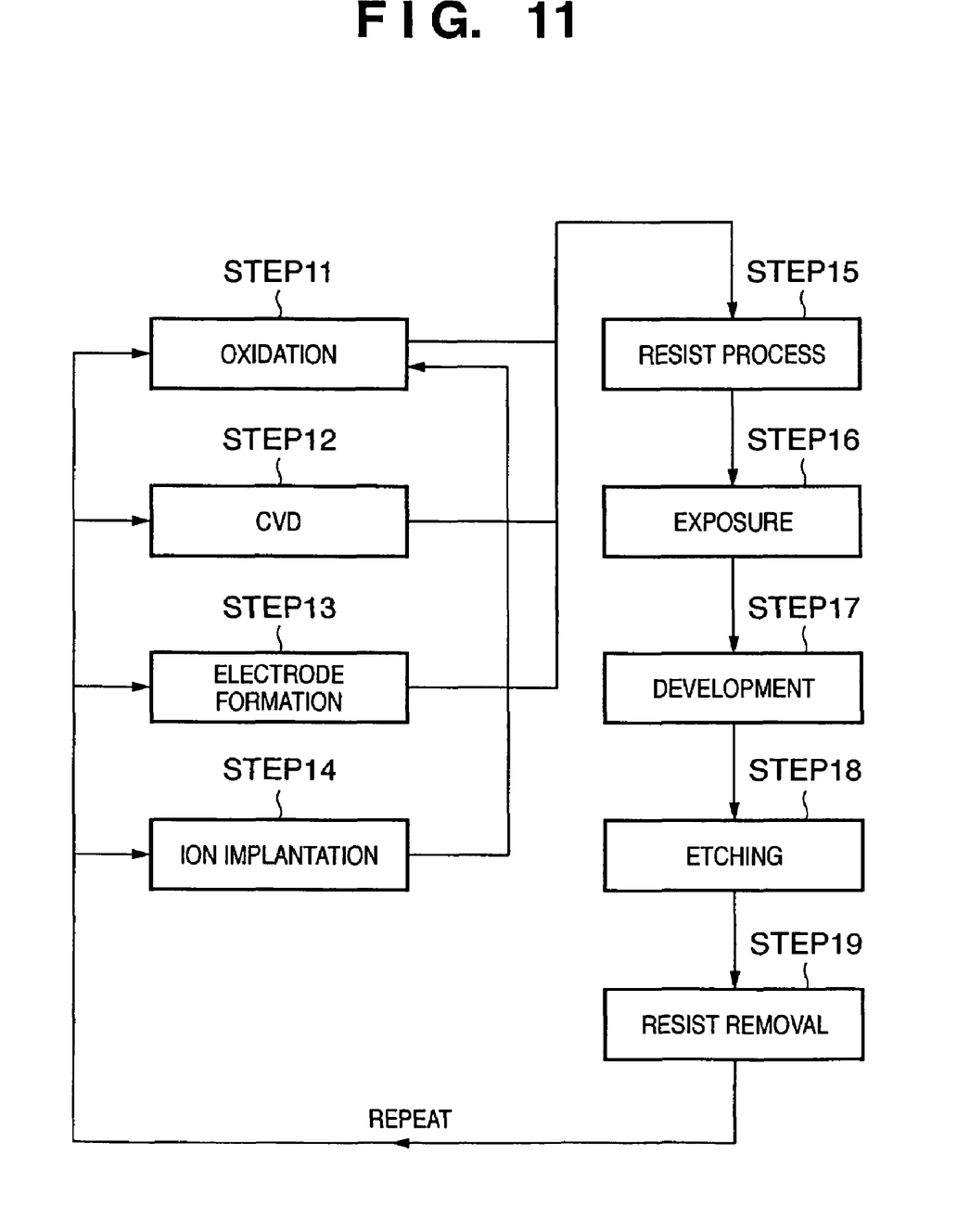
FIG. 11 is a flowchart showing the wafer process.

The wafer process in step 4 includes the following steps (FIG. 11). An oxidation step of oxidizing the wafer surface is executed. A CVD step of forming an insulating film on the wafer surface is executed. An electrode formation step of forming an electrode on the wafer by vapor deposition is executed. An ion implantation step of implanting ions in the wafer is executed. A resist processing step of applying a photosensitive agent to the wafer is executed. An exposure step of exposing, using the above-described exposure apparatus, the wafer having undergone the resist processing step to light, via the mask, on which the circuit pattern is formed to form a latent image pattern on the resist, is executed. A development step of developing the latent image pattern formed on the wafer in the exposure step is executed. An etching step of etching portions other than the resist image developed in the development step is executed. A resist removal step of removing any unnecessary resist remaining after etching is executed. These steps are repeated to form multiple circuit patterns on the wafer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A driving device comprising:
   (a) an electromagnetic actuator including a first coil and a second coil which detects a change in magnetic flux generated by said first coil; and
   (b) an electromagnetic actuator controller which feedback-controls said electromagnetic actuator, wherein said electromagnetic actuator controller comprises:
       (i) a modulator which gives a modulated signal, which is generated based on a target value in the feedback control, to said first coil, wherein the target value is a target thrust of said electromagnetic actuator; and
       (ii) a demodulator which demodulates an output signal from said second coil, and
   said electromagnetic actuator controller includes a scale converter which performs a square-root arithmetic operation for the target value to feedback-control said electromagnetic actuator, based on an output signal from said scale converter and a signal demodulated by said demodulator.

2. The device according to claim 1, wherein said electromagnetic actuator controller feedback-controls said electromagnetic actuator based on the target value and the signal demodulated by said demodulator.

3. The device according to claim 1, wherein said electromagnetic actuator controller includes a phase adjustment unit in at least one of said modulator and said demodulator.

4. The device according to claim 1, wherein said electromagnetic actuator controller includes a filter which removes a harmonic component of the signal demodulated by said demodulator.

5. The device according to claim 1, further comprising:
   a power amplifier which drives said first coil;
   a current detector which detects a current which flows through said first coil; and
   a coil controller which feedback-controls the current which flows through said first coil.

6. The device according to claim 1, wherein said electromagnetic actuator includes an E core and an I core, and both of said first coil and said second coil are attached to said E core.

7. A stage device comprising:
   (1) a coarse moving stage; and
   (2) a fine moving stage, wherein the fine moving stage is driven relative to the coarse moving stage by a driving device, wherein said driving device comprises:
       (a) an electromagnetic actuator including a first coil and a second coil which detects a change in magnetic flux generated by said first coil, and (b) an electromagnetic actuator controller which feedback-controls said electromagnetic actuator,
wherein said electromagnetic actuator controller comprises:
(i) a modulator which gives a modulated signal to said first coil; and
(ii) a demodulator which demodulates an output signal from said second coil.

8. An exposure apparatus comprising:
(1) a driving device;
(2) an optical system to project exposure light applied to a master on which a pattern is formed onto a substrate; and
(3) a stage device which holds the substrate or the master and is aligned by said driving device,
wherein said driving device comprises:
(a) an electromagnetic actuator including a first coil and a second coil which detects a change in magnetic flux generated by said first coil; and
(b) an electromagnetic actuator controller which feedback-controls said electromagnetic actuator, wherein said electromagnetic actuator controller comprises:
(i) a modulator which provides a modulated signal to said first coil; and
(ii) a demodulator which demodulates an output signal from said second coil.

* * * * *